US006375708B1

(12) United States Patent
Dorfman et al.

(10) Patent No.: US 6,375,708 B1
(45) Date of Patent: Apr. 23, 2002

(54) ALLOY FOR ELECTRICAL CONTACTS AND ELECTRODES AND METHOD OF MAKING

(75) Inventors: Leonid P. Dorfman, Sayre; Michael J. Scheithauer, Ulster, both of PA (US); Muktesh Paliwal, Owego, NY (US); David L. Houck, Towanda; James R. Spencer, Sayre, both of PA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 09/652,175

(22) Filed: Aug. 31, 2000

Related U.S. Application Data

(63) Continuation-in-part of application No. 09/392,894, filed on Sep. 19, 1999, now abandoned, which is a continuation of application No. 08/784,159, filed on Jan. 15, 1997, now Pat. No. 5,956,560, which is a division of application No. 08/559,903, filed on Nov. 17, 1995, now Pat. No. 6,103,392, which is a continuation-in-part of application No. 08/362,024, filed on Dec. 22, 1994, now Pat. No. 5,468,457, which is a continuation-in-part of application No. 08/361,415, filed on Dec. 22, 1994, now Pat. No. 5,470,549.
(60) Provisional application No. 60/158,640, filed on Oct. 8, 1999.

(51) Int. Cl.$^7$ .............................. C22C 27/04; B22F 3/12

(52) U.S. Cl. ............................... 75/248; 75/255; 419/6; 419/38

(58) Field of Search ....................... 75/255, 248; 419/6, 419/38

(56) References Cited

U.S. PATENT DOCUMENTS

| 3,418,103 A | 12/1968 | Lasdon ........................... 75/0.5 |
| 5,468,457 A | 11/1995 | Dorfman et al. ............... 423/61 |
| 5,470,549 A | 11/1995 | Dorfman et al. ............... 423/61 |
| 5,956,560 A | 9/1999 | Dorfman et al. ............... 419/38 |
| 6,103,392 A | 8/2000 | Dorfman et al. ............. 428/570 |

FOREIGN PATENT DOCUMENTS

| JP | 64-78684 | 3/1989 | ........... B23K/11/30 |
| JP | 4-371373 | 12/1992 | ........... B23K/11/30 |

OTHER PUBLICATIONS

Basu et al., *Copper–tungsten Composite Powders by the Hydrogen Reduction of Copper Tunsgtate*, J. Mater. Sci., 13 (1978) 2703–2711.
Basu et al., *The Controlled Reduction of Copper Tunsgate in $H_2O/H_2$ Mixtures*, J. Mater. Sci., 14 (1979) 91–99.
Abstract, Wu et al., *Study on the Formation and H2 Reduction of Copper Tungstate*, Zhongnan Kuangye Xueyuan Xuebao (1993), 24 (1), 64–8.
Skorohod et al., *Sintering of Tunsgetn–Copper Composites of Various Origins*, Poroshkovaya Metallurgiya, 9(249) (1983) 9–13.
Frantsevitch, I. N., Electrical Contacts Produced by Powder Metallurgy Methods, Russian Journal of Powder Metallurgy, 1980, vol. 8 (212), pp. 36–47.
Stevens, A. J., Powder–Metallurgy Solutions to Electrical–Contact Problems, Powder Metallurgy, 1974, vol. 17, No. 34, pp. 331–346.
Kothary, N. C., Factors Affecting Tungsten–Copper and Tungsten–Silver Electrical Contact Materials, Powder Metallurgy International, 1982, vol. 14, No. 3, pp. 139–143.
Bregel, T., et al., On the Application of W/Cu Materials in the Fields of Power Engineering and Plasma Technology, IEEE Transactions on Components, Hybrids, and Manufacturing Technology, 1991, vol. 14, No. 1, pp. 8–13.
Gessinger, G. N. and K. N. Melton, Burn–off Behaviour of W–Cu Contact Materials in an Electric Arc, Powder Metallurgy International, 1977, vol. 9, No. 2, pp. 67–72.
Slade, P. G., Arc Erosion of Tungsten Based Contact Materials: A Review, International Journal of Refractory and Hard Metals Dec. 1986, pp. 208–214.
Lemeshko, A. M., et al., Electrical Erosion Resistance of Refractory Metal Base Composites, Russian Journal of Powder Metallurgy, 1974, vol. 3 (135), pp. 70–73.
Hayden, H. W. and J. H. Brophy, The Activated Sintering of Tungsten with Group VIII Elements, Journal of the Electrochemical Society, 1963, vol. 110, No. 7, pp. 805–810.
Brophy, J. H., et al., The Final Stages of Densification in Nickel–Tungsten Compacts, Transactions of the Metallurgical Society of AIME, 1962, vol. 224, pp. 797–803.
Teodorovich, O. K. and G.V. Levchenko, Nickel in Tungsten–Copper Compacts, Russian Journal of Powder Metallurgy, 1964, vol. 6 (24), pp. 43–47.
Teodorovich, O. K., et al., Reactions at Phase Boundaries in Pseudoalloys Based on Tungsten (Molybdenum) and Copper, Russian Journal of Powder Metallurgy, 1980, vol. 12 (216), pp. 39–44.
Moon, I. H. and J. S. Lee, Activated Sintering of Tungsten–Copper Contact Materials, Powder Metallurgy, 1979, vol. 1, pp. 5–7.
Lee, J. S., et al., Influence of W–Particle Size on Electrical Contact Property of Ni–Doped W–Cu Contact Materials, International Journal of Refractory and Hard Materials, Jun. 1986, pp. 113–116.

(List continued on next page.)

*Primary Examiner*—Ngoclan Mai
(74) *Attorney, Agent, or Firm*—Robert F. Clark

(57) ABSTRACT

A W—Cu—Ni alloy having thermophysical properties suitable for use in electrical contacts and electrodes is described. The alloy is formed by direct sintering of a powder blend comprising a tungsten-copper composite powder and a nickel powder. The tungsten-copper composite powder component of the blend comprises individual dual phase particles having a copper phase and a tungsten phase wherein the tungsten phase substantially encapsulates the copper phase. The method for direct sintering the W—Cu—Ni alloy substantially eliminates the formation of brittle intermetallics and slumping during sintering.

21 Claims, 7 Drawing Sheets

OTHER PUBLICATIONS

Novoselova, I. A., et al., Electrochemical Synthesis of Intermetallic Compounds and Complex Carbides Based on Molybdenum (Tungsten) and Cobalt (Nickel), Powder Metallurgy and Metal Ceramics, 1996, vol. 35, Nos. 3–4, pp. 113–117.

Churn, K.–S. and D. N. Yoon, Pore Formation and Its Effect on Mechanical Properties in W–Ni–Fe Heavy Alloy, Powder Metallurgy, 1979, No. 4, pp. 175–178.

Johnson, J. L. and R. M. German, A Theory of Activated Liquid Phase Sintering and Its Application to the W–Cu System, Adv. Powder Met. Part. Mater., 1992, vol. 3, pp. 35–46.

Johnson, J. L. and R. M. German, Phase Equilibria Effects on the Enhanced Liquid Phase Sintering of Tungsten–Copper, Metallurgical Transactions A, 1993, vol. 24A, pp. 2369–2377.

Brophy, J. H., et al., The Nickel–Activated Sintering of Tungsten, Powder Metallurgy, Ed. W. Leszynski, Interscience Publishers, 1961, pp. 113–135.

Mu, Keqiang, et al., Study on Brittleness and Thermal Shock Resistance of W–Cu Composite, Proceedings of the $14^{th}$ International Plansee Seminar, 1997, vol. 1, pp. 381–392.

Ermolaev, B. I., Thermal Expansion of Tungsten–Copper Pseudoalloys Containing up to 25–30 vol. % Copper, Russian Journal of Powder Metallurgy, 1971, vol. 3 (99), pp. 45–50.

Li, K. C. and C. Y. Wang, Tungsten, Reinhold Publishing Corporation, New York, (1955) pp. 373–375.

Brophy, J. H., et al., The Sintering and Strength of Coated and Co–Reduced Nickel Tungsten Powder, Transactions of the Metallurgical Society of AIME, 1961, vol. 221, pp. 1225–1231.

Long, J. H., et al., The Activity and Crystal Structures of Mixed Metal Catalysts, Journal of American Chemical Society, 1934, vol. 56, pp. 1101–1106.

ALLOY FOR ELECTRICAL CONTACTS AND ELECTRODES AND METHOD OF MAKING

CROSS-REFERENCE TO RELATED APPLICATIONS

This application is a continuation-in-part of application Ser. No. 09/392,894, filed Sep. 9, 1999 now abandoned, which is a continuation of application Ser. No. 08/784,159, filed Jan. 15, 1997, now U.S. Pat. No. 5,956,560, which is a division of application Ser. No. 08/559,903, filed Nov. 17, 1995, now U.S. Pat. No. 6,103,392, which is a continuation-in-part of application Ser. Nos. 08/362,024 and 08/361,415, both filed Dec. 22, 1994, now U.S. Pat. Nos. 5,468,457 and 5,470,549, respectively, all of which are incorporated herein by reference. This application claims the benefit of U.S. Provisional Application No. 60/158,640, filed Oct. 8, 1999.

FIELD OF THE INVENTION

This invention relates to materials for electrical contacts and electrodes. In particular, this invention relates to tungsten-copper composites.

BACKGROUND OF THE INVENTION

Alloys for electrical contacts and electrodes are metallurgical composites based on heterogeneous systems (pseudoalloys) of two or more components with vastly different thermophysical properties. The properties of these alloys represent optimal combinations of the component characteristics and are required for operation in applications such as high-current interrupters with gas or oil as arc quenching media, electrical discharge machining, spot welding, and other applications employing an electrical discharge. Common to these applications is the electrical arcing which occurs between the contacts or between an electrode and a workpiece. For example, electrical contacts serve as points of arc attachment at current switching. Despite the momentary duration of switching, electric arcs in oil- or gas-filled high-current interrupters fully develop into high temperature plasma discharges. At the points of arc attachment, plasma discharges generate electrodynamic forces and thermal fluxes causing erosive wear of electrical contacts. Material erosion reaches its peak in electrical contacts operating in an oxidizing environment (e.g., air-blast high-current interrupters). To withstand this wear, electrical contact materials must possess specific thermophysical properties.

Tungsten-copper composites are preferred materials for these applications. However, electrical contacts made from unalloyed W—Cu composites are prone to cracking in electrical discharge environments. The problem appears to stem from the poor thermal shock resistance of the composite. When the structural continuity is partially or totally disrupted by the loss of copper due to arc heating, the composite loses the ability to undergo plastic deformation as a single structure. If excessive thermal fluxes produced by the arc attachment to the contact are not dissipated quickly, the thermal shock generates high thermal stresses and cracks in the contact. For composites with an average tungsten grain size of about 20 µm, cracking occurs after a period of more or less even ablation. Tungsten-copper composites with an average tungsten grain size of about 5 µm show greater cracking, apparently resulting from further sintering of the tungsten which causes significant shrinkage and pore formation. The erosion rate and cracking can increase considerably if the pore volume in the composite material exceeds approximately 4%.

In addition to thermal shock resistance, the tungsten-copper materials used in these applications should possess resistance to loss of copper, resistance to erosion, and resistance to corrosion. Conventional solutions to these requirements include alloying with 4–5 weight percent (wt. %) Ni and maintaining a low pore volume.

Two basic powder metallurgical (P/M) techniques are used to make W—Cu—Ni alloys for electrical contacts and electrodes: sintering/infiltration and direct sintering. Sintering/infiltration is a two-step manufacturing process which consists of (1) pressing elemental W powder and sintering the compact using one thermal cycle to form a refractory component skeleton (or framework) with controlled porosity, and (2) infiltrating the skeleton with the electrically/thermally conductive Cu component using another thermal cycle. The sintering/infiltration technique does not allow fabrication of net-shape components and the use of fine W powders (FSSS<5 µm). In particular, fine W powders promote localized densification in the W skeleton resulting in partially closed porosity which cannot be infiltrated with Cu. High-temperature sintering (above 1450–1500° C.) of W in the presence of liquid Ni promotes the growth of W grains in the skeleton. Brittle W—Ni intermetallics form along the W grain boundaries during high-temperature sintering of W in the absence of Cu. This degrades the mechanical properties of the W skeleton. In addition, it is difficult to assure uniformly distributed contacts between the W and Ni particles when Ni is used as a sintering aid for W powder.

Conventional direct sintering consists of blending and compacting of the W, Cu, and Ni powders with an average particle size of about 5 µm. Then, depending on the Cu content, the compacts are sintered at temperatures above or below the melting point of Cu. Conventional direct sintering approaches suffer from an inability to separately sinter a strong W skeleton to act as the alloy backbone. In addition, there are problems with (1) excessive coalescence and solid-state sintering of Cu prior to melting, (2) excessive coagulation of Cu at melting, (3) Cu bleedout from an improperly sintered W skeleton, (4) development of excessive porosity (>4%), (5) disintegration of the W skeleton, and (6) loss of shape (slumping).

Enhanced sintering of W—Cu is strongly influenced by the formation of a Cu-based liquid phase above 1083° C. Ni and Cu have an unlimited mutual solubility which in combination with partial solubility of W in Ni (38 wt. % of W in Ni at 1100° C.) greatly improves the wetting of W by Cu and eliminates Cu bleedout. The sintered density, strength, and microhardness increase linearly with Ni additions. The affinity of Ni for both Cu and W introduces a solution-reprecipitation mechanism for sintering W. Operation of this mechanism reaches a significant level at Ni concentrations in the alloy of at least 2 wt. %.

The Cu—Ni liquid phase is chemically active with respect to W. It begins dissolving W and forming a Cu—Ni—W matrix. Due to the limited solubility of W in Ni, the concentration of dissolved W in the matrix eventually reaches an equilibrium level. Formation of the Cu—Ni—W matrix turns on the solution-reprecipitation mechanism which affects the sintering of W. The matrix acts as a W carrier by dissolving tiny W particles and necks, and transporting and redepositing W onto surfaces of larger particles causing their further growth. This thermodynamically warranted process is governed by kinetic parameters such as the concentration of Ni in the matrix, the size of W particles, and the temperature. Microstructure and mechanical properties of W—Cu—Ni alloys produced by a solution-reprecipitation mechanism are strongly influenced by two metallurgical phenomena, the Kirkendall effect and Ostwald ripening. Higher diffusion rates of Cu and W in Ni, compared to those for Ni in Cu and W, result in formation of pores and voids (the Kirkendall effect) which may not be totally eliminated by sintering. Coarsening and spheroidization of W particles in the presence of an active Cu—Ni liquid phase (Ostwald ripening) may lead to porosity, disintegration of the W skeleton, and loss of shape (slumping) of the sintered material. Due to the above effects, alloys made by a solution-reprecipitation sintering technique are very sensitive to processing conditions. Even slight changes in sintering temperature will cause a drastic reduction in strength and ductility of these alloys. Depending on the shape and size of pores, significant fluctuations of strength and ductility are observed even though the sintered density of the alloys may be within 99% of theoretical density (TD).

OBJECTS OF THE INVENTION

It is an object of this invention to obviate the disadvantages of the prior art.

It is another object of the invention to provide a W—Cu—Ni alloy having thermophysical properties suitable for use in electrical contacts and electrodes.

It is yet another object of the invention to provide a powder blend for forming a W—Cu—Ni alloy having thermophysical properties suitable for use in electrical contacts and electrodes.

It is a further object of the invention to provide a method for direct sintering a W—Cu—Ni alloy which substantially eliminates the formation of brittle intermetallics and slumping during sintering.

In accordance with an object of the invention, there is provided a powder blend for making a W—Cu—Ni alloy comprising a W—Cu composite powder and a nickel powder, the W—Cu composite powder comprising individual particles having a tungsten phase and a copper phase wherein the tungsten phase substantially encapsulates the copper phase.

In accordance with another object of the invention, there is provided a W—Cu—Ni alloy comprising a sintered tungsten skeleton containing a Cu—Ni matrix, the alloy having no brittle intermetallics.

In accordance with a further object of the invention, there is provided a method for forming a W—Cu—Ni alloy comprising:

(a) forming a powder blend of a W—Cu composite powder and a nickel powder, the W—Cu composite powder comprising individual particles having a tungsten phase and a copper phase wherein the tungsten phase substantially encapsulates the copper phase;

(b) pressing the powder to form a compact; and (c) sintering the compact to form a W—Cu—Ni alloy.

DESCRIPTION OF THE PREFERRED EMBODIMENTS

Figure 1:
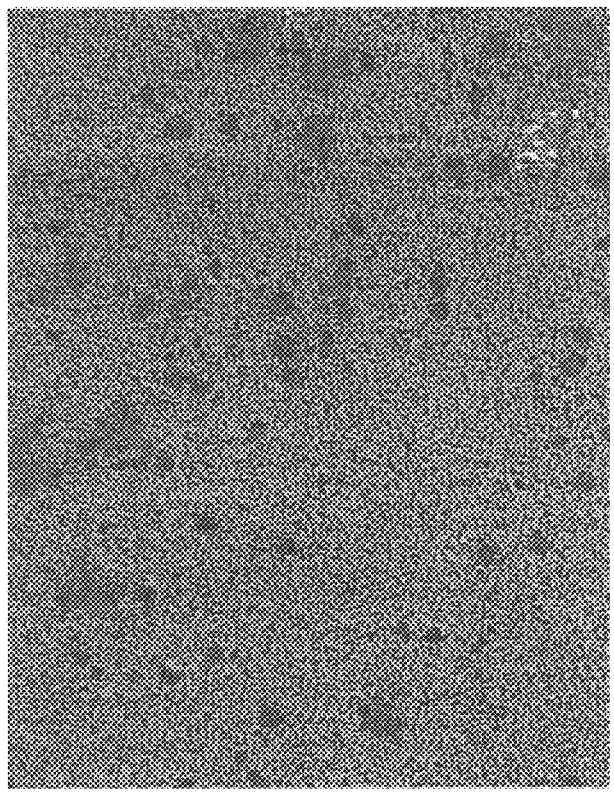
FIGS. 1–10 are optical micrographs (500×) of the microstructure of a W—Cu—Ni alloy in various stages of the sintering cycle.
Figure 2:
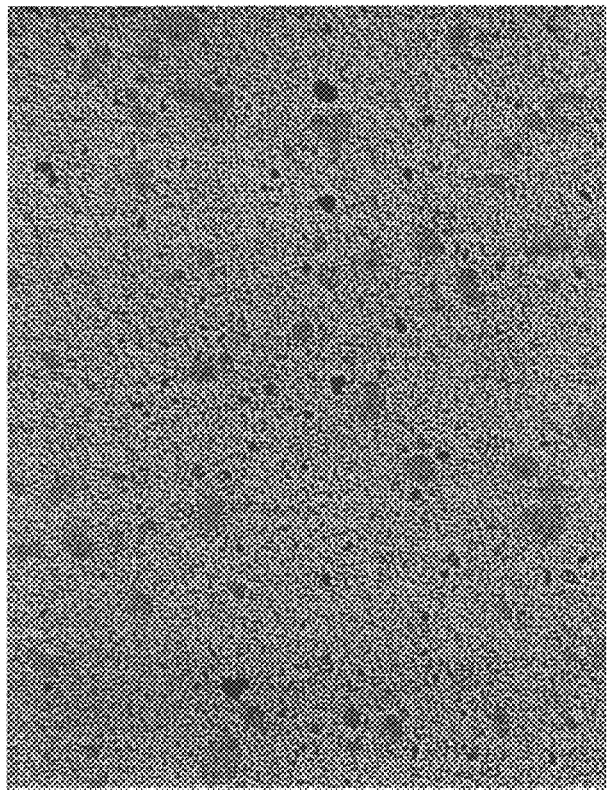
Figure 3:
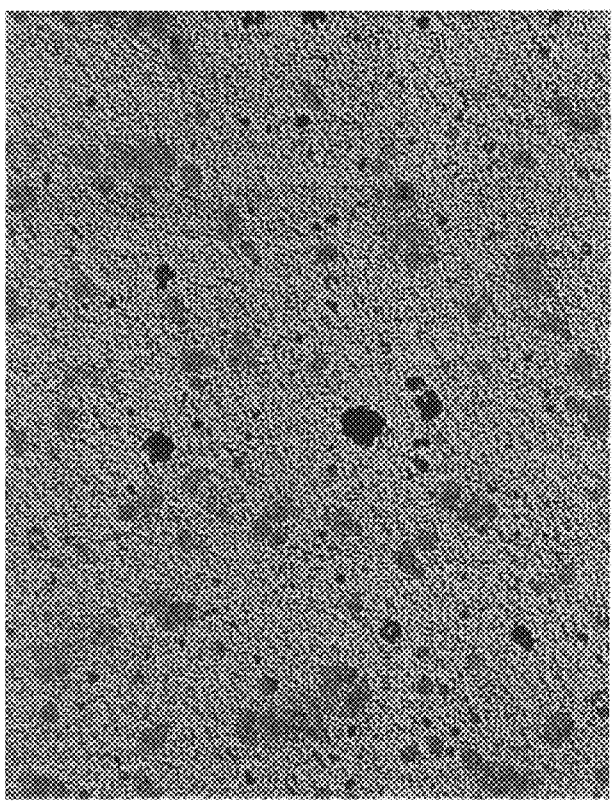
Figure 4:
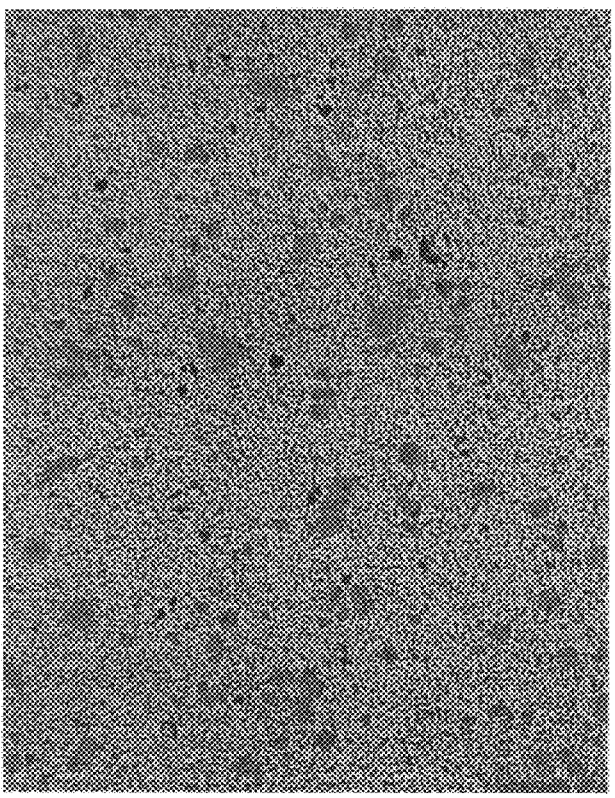
Figure 5:
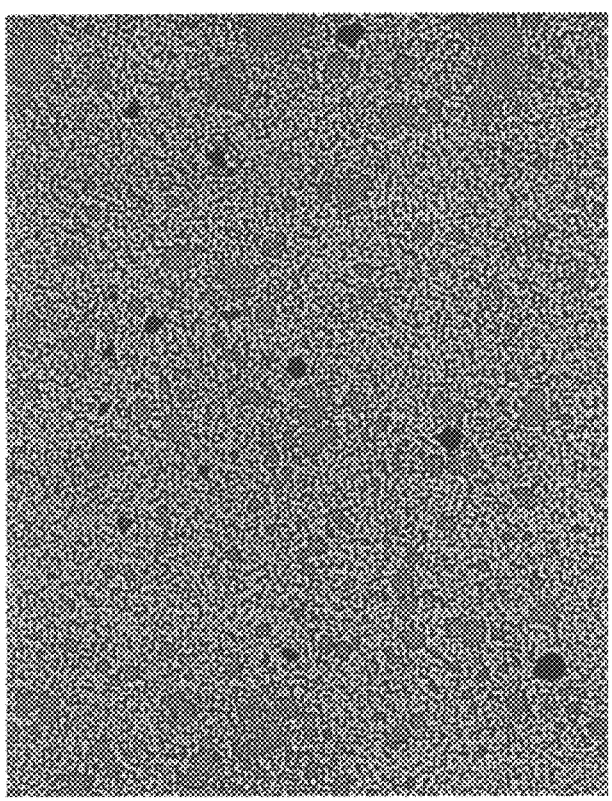
Figure 6:
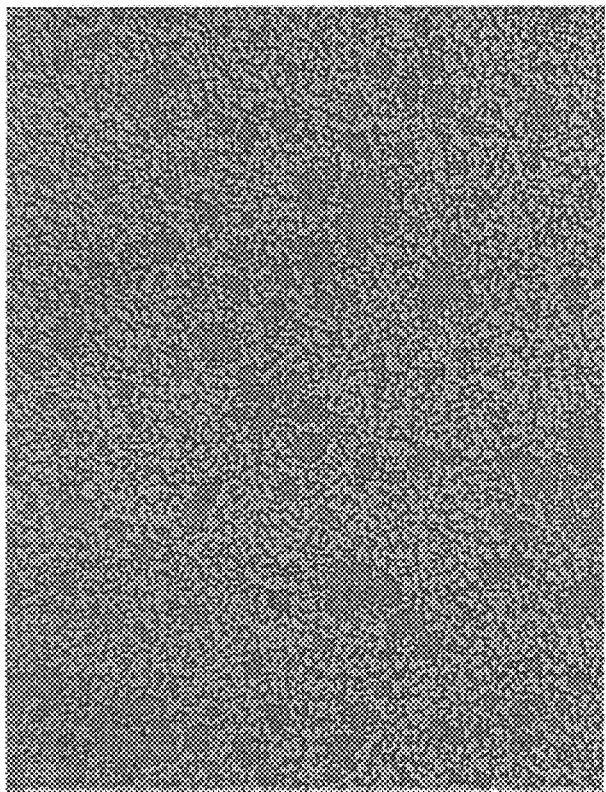
Figure 7:
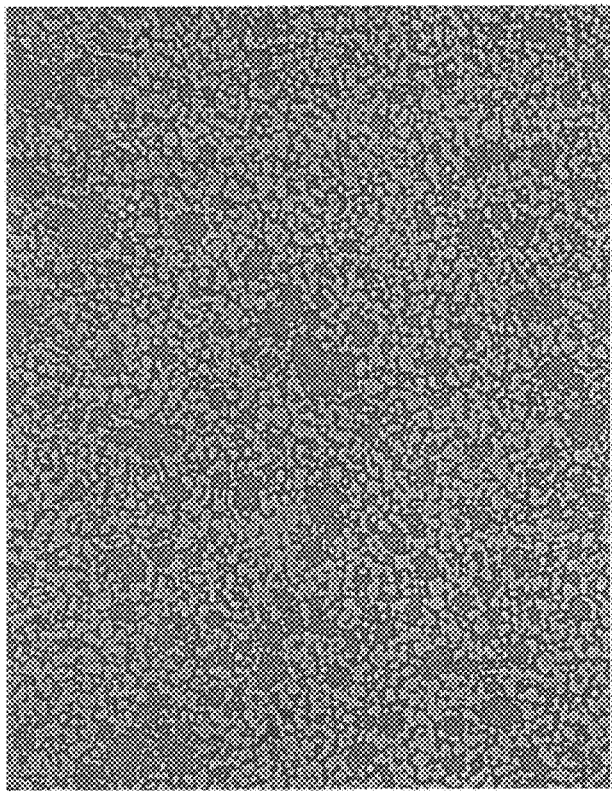
Figure 8:
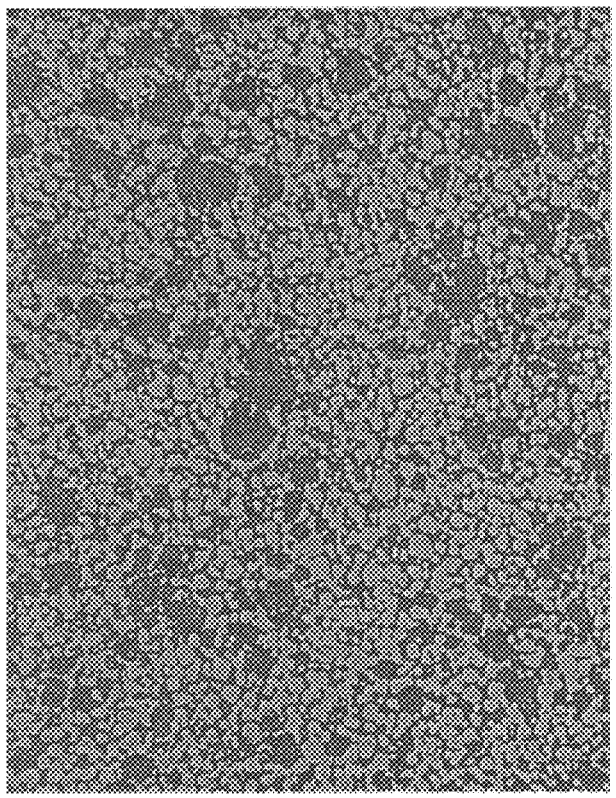
Figure 9:
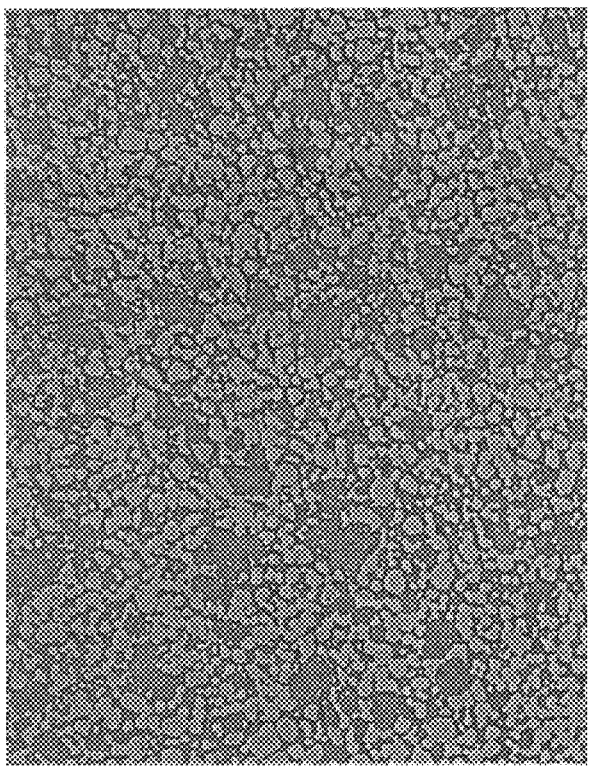
Figure 10:
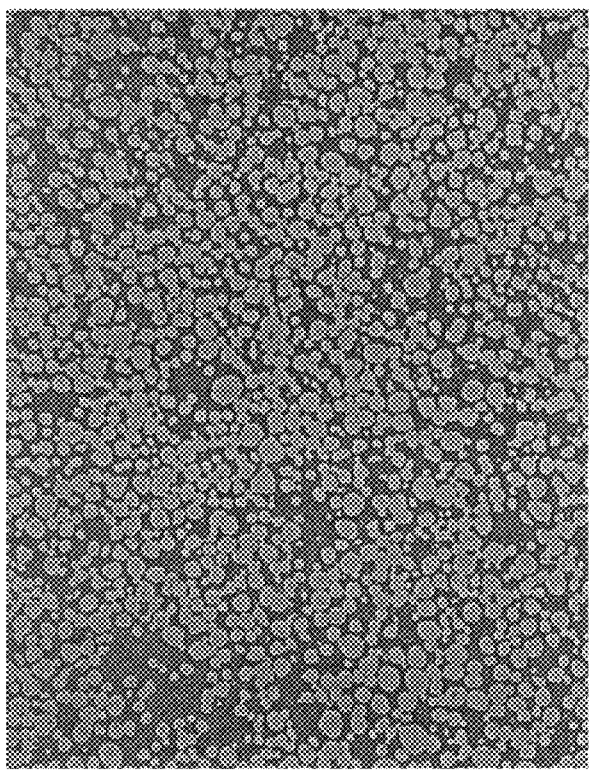

The tungsten-copper (W—Cu) composite powders used in this invention are described in U.S. Pat. No. 5,956,560 issued Sep. 21, 1999 to Dorfman et al., which is incorporated herein by reference. These powders contain individual particles each having a tungsten phase and a copper phase wherein the tungsten phase substantially encapsulates the copper phase. The W—Cu composite powder is mechanically blended with a nickel powder to form a powder blend which is then pressed and sintered to form the W—Cu—Ni alloy. The unique distribution of the tungsten and copper phases in the individual particles of the W—Cu composite powder combined with the nickel phase presents two important technical advantages in achieving the direct sintering of the compacted powder blend to form net-shape articles of the W—Cu—Ni alloy.

The first technical advantage is the ability to selectively activate the sintering of a W framework in-situ in the presence of, and without interference by, the Cu phase. In the W—Cu composite powders used herein, the W and Cu phases are not a mechanical mixture of elemental powders. Instead, the individual particles of the W—Cu composite powder are dual phase particles comprised of a tungsten phase which substantially encapsulates a copper phase. Because the tungsten phase exists on the exterior of the particles, the Cu phase does not interfere with the formation of predominantly W—W and W—Ni—W contacts upon compaction of the powder blend. Due to the submicron size and high sintering activity of the W phase, these contacts facilitate in-situ sintering of a W framework in the solid-state sintering region (950–1050° C.) prior to the melting of the Cu. Also, by removing diffusion barriers and improving the W—W mass transport, the Ni phase selectively activates the solid-state sintering of the W phase. Compared to sintering without activation, the shrinkage of the compact increases several times which results in a much more rigid W framework.

The second technical advantage is the ability to provide, as two separate steps of the same sintering cycle, conditions for (i) formation of a Cu—Ni melt, and (ii) the controlled modification of the W framework by the Cu—Ni melt to impart ductility (yield and elongation) to the W—Cu—Ni alloy. At temperatures equal to or above the melting point of Cu (1083° C.), liquid Cu promotes complete densification of the W framework by enhancing the W particle rearrangement and shape accommodation. Formation of a Cu—Ni melt also begins at the above temperatures with all of the Ni gradually going into the melt due to unlimited mutual solubility of Cu and Ni. The Cu—Ni melt is kept inside the W framework by capillary forces. Since W is partially soluble in Ni, the dissolved Ni increases the diffusion rate of W into the Cu—Ni melt facilitating the transport process of W into the melt and the modification of the W framework by the melt. The Cu—Ni melt begins dissolving W and forming a Cu—Ni—W matrix. Formation of a Cu—Ni—W matrix turns on the solution-reprecipitation mechanism for the W phase. The matrix acts as a W carrier by dissolving tiny W particles and necks and, after becoming saturated with W, redepositing the dissolved W on larger W particles causing their further growth. The Kirkendall effect manifests itself by porosity development and coagulation of pores; these pores eventually disappear in the course of controlled exposure of the composite material to the solution-reprecipitation process. The process exerts a profound effect on the contiguity (W grain interface), size, and morphology of W particles forming the framework. By rounding off the particles and increasing their size, it loosens up the bond between W particles in the framework thereby weakening it and imparting ductility (yield and elongation) to the sintered W—Cu—Ni alloy. If allowed to proceed in an uncontrolled manner, the solution-reprecipitation process, by the effect of Ostwald ripening, will eventually lead to complete disintegration of the W framework (zero contiguity of the W phase) and loss of shape (slumping). Therefore, by varying the time-temperature parameters of the solution-reprecipitation process, the properties of the W framework and of the sintered composite W—Cu—Ni product can be modified from being hard and brittle (after activated solid-state sintering), to having moderate mechanical strength and ductility (after controlled exposure to the solution-reprecipitation process), to being weak and prone to slumping (after the effect of Ostwald ripening).

The following parameters and materials are preferred for the making of the W—Cu—Ni alloy of this invention.

A. Tungsten-copper Composite Powder
  Copper content: about 10 to about 25 wt. %
  Median particle size: about 0.5 to about 20 µm
  Thickness of the tungsten phase on the particles: about 0.1 to about 0.2 µm B. Nickel Powder
  Median particle size: about 1 to about 15 µm C. Powder Blend
  Weight ratio of copper to nickel: about 4.0:1 to about 4.2:1

The more preferred Cu:Ni weight ratio is 4.1:1. This ratio is based on an $Cu_{3.8}Ni$ solid solution which has a known XRD pattern. (A Cu:Ni atomic ratio of 3.8:1 has a weight ratio of 4.1:1.) The Cu:Ni ratio is kept within the narrow range in order to verify by XRD that no brittle intermetallics have been formed in the alloy.

The preferred range of weight ratios for the alloy compositions is from 82 wt. % W and 18 wt. % (Cu:Ni=4.1:1) to 70 wt. % W and 30 wt. % (Cu:Ni=4.1:1).

The amount of Ni preferably comprises about 3 to about 6 wt. % of the blend and, more preferably, about 4 wt. %.

D. Pressing and Sintering
  Compaction pressure: about 45 to about 70 ksi
  Sintering temperature: about 1180° C. to about 1200° C.; more preferably about 1190° C.
  Sintered density: 99±0.5% theoretical density; more preferably at least about 99% TD E. Alloy Properties
  Elongation: about 2% to about 20%; more preferably about 3% to about 5%.
  Calculated average W particle size: about 2.5 to about 15.0 µm.
  Contiguity of tungsten skeleton: about 15% to about 30%.

The following non-limiting examples are presented.

EXAMPLES

Tungsten-copper composite powders and a nickel powder with a median particle size of 8.8 µm were used in preparation of the feedstocks for making three different compositions of the W—Cu—Ni alloy. A solid lubricant (0.5 wt. % of Acrawax C produced by Lonza Co. in Fair Lawn, N.J.) was added to powder feedstocks to improve pressibility. Feedstocks were prepared in a V-blender with an intensifier bar by blending an 8 kg powder batch for 60 minutes. Powder ratios and alloy compositions are provided in Table 1. The Cu:Ni weight ratio was maintained at 4.1:1.

TABLE 1

| Alloy | W-Cu Composite Powder Copper (wt. %) | W-Cu Composite Powder Median Size (µm) | Ni Powder (g per 100 g of W-Cu Powder) | Alloy Composition W (wt.%) | Alloy Composition (Cu:Ni = 4.1:1) (wt. %) |
|---|---|---|---|---|---|
| A | 15 | 6.9 | 3.66 | 82 | 18 |
| B | 20 | 13.9 | 4.9 | 76.3 | 23.7 |
| C | 25 | 16.1 | 6.1 | 70.7 | 29.3 |

Sintering tests were conducted with the use of powder feedstock to make the alloy B. A quantity of about 7.5 kg of the feedstock was isostatically pressed at 45 ksi into a slug with a green density of about 56% of theoretical density (TD) and approximate dimensions of 3.75 inches in diameter by 4.75 inches long. Dewaxing and sintering were carried out in a tube furnace with flowing dry hydrogen. The rate of temperature increase was 2° C./minute. The slug was dewaxed at 450° C. for 4 hours and presintered at 1000° C. for 4 hours. The presence of nickel dramatically increased the solid-state sintering of W—Cu composite powder. A linear shrinkage of about 20% was observed compared to a linear shrinkage of about 5% without nickel.

Figure 11:
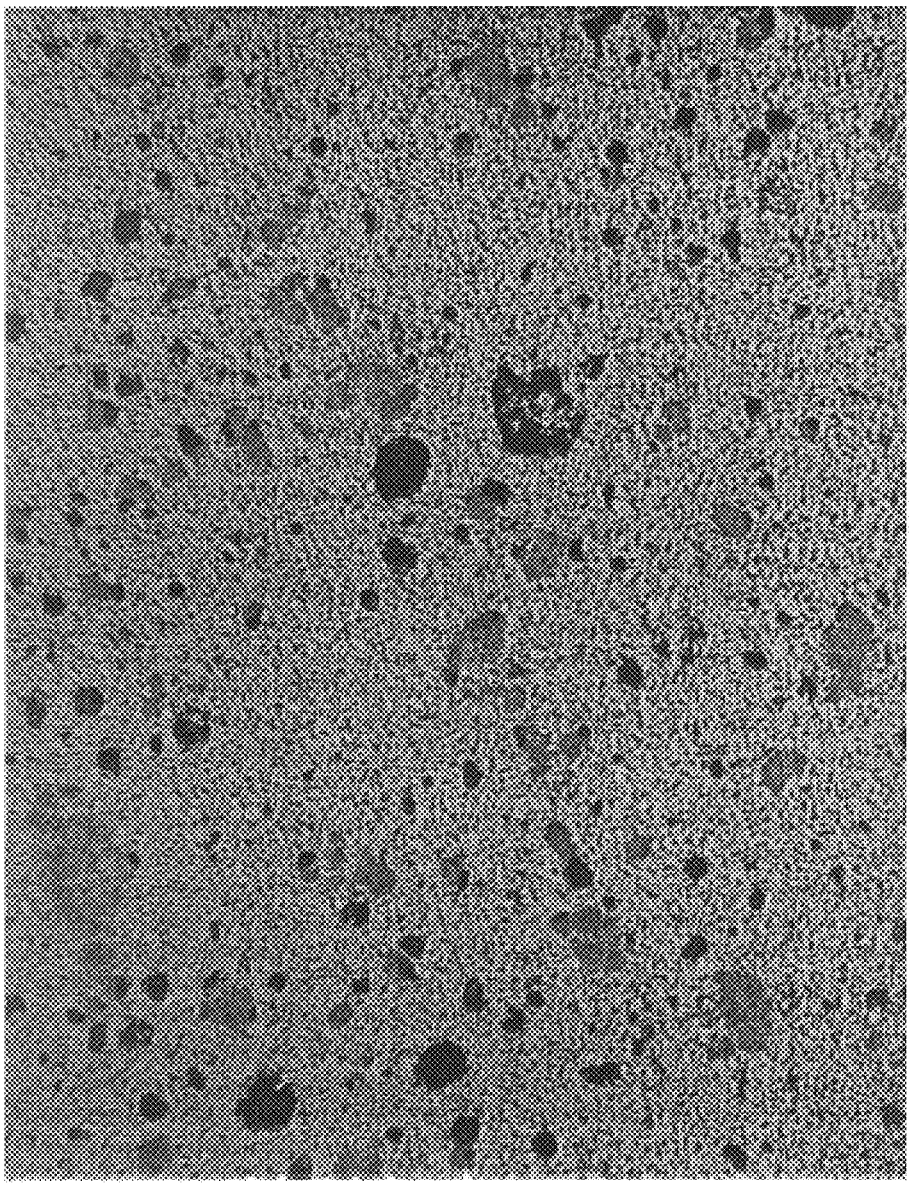
FIG. 11 is an optical micrograph (500×) of the microstructure of a presintered compact of the W—Cu—Ni alloy.

The presintered slug was cut longitudinally into eight sections weighing about 930 g each. These sections were used in systematic liquid-phase sintering tests. Optical microscopy (OM), Scanning Electron Microscopy (SEM), Energy Dispersive X-ray Spectroscopy (EDS), X-Ray Diffraction (XRD), and other standard methods of physical testing, such as yield strength (YS), ultimate tensile strength (UTS), transverse rupture strength (TRS), hardness, etc., were used in alloy characterization. The test data are presented in Table 2 and in FIGS. 1 to 10 which correspond to the samples in Table 2. FIG. 11 shows the microstructure of the presintered slug. The presintered slug had the lowest sintered density (92.9% TD) and finest size W grains. This is characteristic of the material produced by solid-state sintering.

The evolution of the microstructure and properties of the W—Cu—Ni alloy made by liquid-phase sintering is controlled by the temperature and time parameters of the sintering cycle which, in turn, control the solution-reprecipitation mechanism and growth of W particles. The concentration of W in the Cu—Ni—W matrix increases with holding time from about 0.8 wt. % to an equilibrium level of about 2 wt. % to about 2.2 wt. % for the range of processing temperatures (Table 2). Three distinct microstructure-property ranges are observed.

In samples 1–5 (FIGS. 1–5), the tungsten particles were fine and highly interconnected. The grain count was $[500-1200] \times 10^3$ grains/mm² yielding a calculated average particle diameter of 1–1.6 µm. This range is associated with formation of a strong tungsten framework and a gradual increase in the density (up to 95–96%TD) and mechanical properties of the sintered alloy (UTS, TRS, hardness). However, the alloy remains brittle under these conditions. Even a fivefold increase in residence time did not produce any significant change in the material's properties.

In samples 6–9 (FIGS. 6–9), the tungsten particles were medium size, less interconnected, and partially rounded. The grain count was $[60-90] \times 10^3$ grains/mm² yielding a calculated average particle diameter of 2.6–4.6 µm. This range is characterized by a continued increase in the sintered density (up to 97.6%TD), the elimination of pores and voids including those generated by the Kirkendall effect (FIGS. 7 and 8), and the appearance of elongation (ductility) in the alloy (up to 10% elongation in sample 8). The presence of Ni lowered the electrical conductivity to less than 18% IACS.

In sample 10 (FIG. 10), the particles were rounded and weakly connected. The grain count was below $60 \times 10^3$ grains/mm² yielding a calculated average particle diameter of above 4.6 µm. The particle rounding is a result of Ostwald ripening and caused a substantial disintegration of the W framework, a lowering of the mechanical properties and density, and slumping of the sample during sintering.

TABLE 2

TEST RESULTS ON PROCESSING OF ALLOY B (76.3W-23.7(Cu:Ni = 4.1:1))

| Sample No. | Sintering Conditions | Matrix (wt. %, balance Cu) Ni | W | W Grain Count ($10^3$ grains/mm$^2$) | Calc. Ave. Dia. ($\mu$m) | YS (MPa) | UTS (MPa) | TRS (MPa) | Hardness[1] HRC | HV1 | % Elong-ation | Conductivity (% IACS) | Density (g/cc) |
|---|---|---|---|---|---|---|---|---|---|---|---|---|---|
| 1 | 1100° C. 1 hr | 19.83 | 0.83 | 1177 | 1 | 0 | 760 | 1380 | 29.1 | 306 | 0 | 16.12 | 14.07 |
| 2 | 1100° C. 2 hr | 19.96 | 1.35 | 1136 | 1 | 0 | 740 | 1310 | 28 | 306 | 0 | 16.3 | 14.25 |
| 3 | 1100° C. 3 hr | 20.09 | 1.4 | 951 | 1.2 | 0 | 760 | 1510 | 26.3 | 301 | 0 | 16.96 | 14.3 |
| 4 | 1100° C. 4 hr | 19.22 | 2.34 | 771 | 1.3 | 0 | 800 | 1520 | 27.2 | 309 | 0 | 16.85 | 14.56 |
| 5 | 1150° C. 1 hr | 19.38 | 2.19 | 492 | 1.6 | 0 | 880 | 1590 | 25.9 | 293 | 0 | 17.06 | 14.4 |
| 6 | 1200° C. 1 hr | 19.96 | 2 | 189 | 2.6 | 780 | 800 | 1720 | 23.6 | 290 | 1 | 17.72 | 14.58 |
| 7 | 1200° C. 2 hr | 19.96 | 2.19 | 113 | 3.4 | 670 | 750 | 1720 | 19.6 | 268 | 4 | 17.67 | 14.79 |
| 8 | 1200° C. 3 hr | 19.71 | 1.97 | 85 | 3.9 | 650 | 750 | 1T720 | 20.4 | 255 | 10 | 17.69 | 14.56 |
| 9 | 1200° C. 4 hr | 20.12 | 1.03 | 59 | 4.6 | 630 | 710 | 1720 | 20.1 | 252 | 4 | 17.67 | 14.65 |
| 10 | 1250° C. 1 hr | 19.66 | 2.22 | 48 | 5.2 | 470 | 530 | 964 | 15.7 | 249 | 0 | 16.62 | 14.51 |

[1]HRC - Rockwell C hardness at 150 kg load
HV1 - Vickers hardness at 1 kg load

Referring to the test data in Table 2, it is obvious that alloy elongation resulted from a controlled trade off between the UTS and ductility of the material. UTS and hardness were gradually built up in the samples 1–5. Ostwald ripening increased the particle diameter, decreased the grain count, and lowered the contiguity of the W framework in samples 6–8. This resulted in weakening of the W framework (appearance of a yield point and YS; attainment of the highest TRS value) and the highest material ductility in sample 8. Further weakening of the W framework in samples 9 and 10 led to slumping of the alloy.

The microstructure of sample 8 (FIG. 8) is typical of a W heavy alloy produced by liquid phase sintering, only it is much finer. The only peaks determined by XRD were those which belonged to W and the $Cu_{3.8}Ni$ solid solution. To the extent of sensitivity of the XRD method, it can be concluded that formation of brittle intermetallics was eliminated in the process of manufacturing the alloy.

Figure 12:
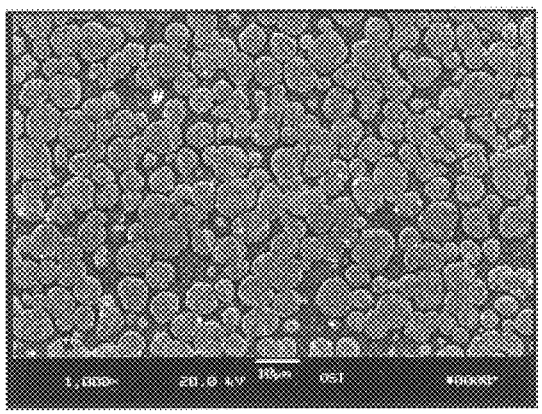
FIGS. 12–14 are SEM micrographs (1000×) of the microstructures of three W—Cu—Ni alloys having different compositions.
Figure 13:
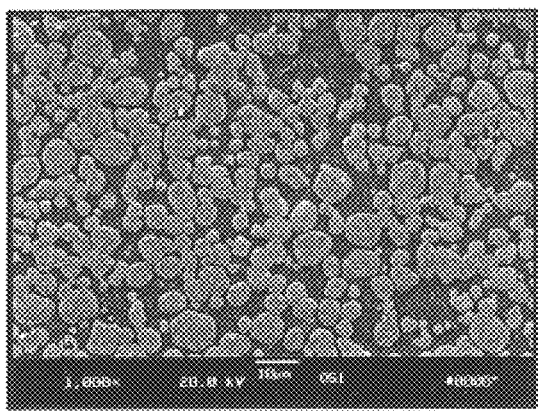
Figure 14:
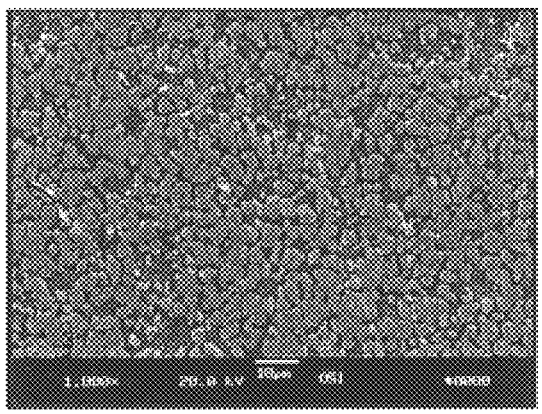

Feedstock quantities of alloy compositions A, B and C (about 4.3–4.5 kg) were pressed as described for samples 1–10. To improve the uniformity of heat transfer to green compacts, they were dewaxed and sintered in pure alumina sand using the same conditions. The sintering produced slugs with approximate dimensions of 1.75 inches in diameter×7.5 inches long. Sintering cycles included three isothermal holds. The first was at 1000° C. for hydrogen cleaning of oxygen from the powder compacts. The next was at 1100° C. for removing oxygen from the molten copper, formation of a Cu—Ni solid solution, and presintering of the compacts. The final hold was at the sintering temperature. Final sintering conditions for the alloy were optimized for obtaining the highest elongation without slumping of the alloys. The data in Table 3 represent averages of six determinations on separate samples of the alloy. FIGS. 12, 13 and 14 are SEM photomicrographs of the microstructure of alloys A, B, and C, respectively.

TABLE 3

| Alloy | Composition (wt. %) | Sintering Cycle, ° C. - Hours | YS (Mpa) | UTS (Mpa) | Elongation (%)[1] | % TD | % IACS |
|---|---|---|---|---|---|---|---|
| A | 82W - 18(Cu:Ni = 4.1:1) | 1000° C., 4 hr 1100° C., 4 hr 1200° C., 4 hr | 553 | 605 | 2.8 | 98.8 | 19.5 |
| B | 76.3W - 23.7(Cu:Ni = 4.1:1) | 1000° C., 4 hr 1100° C., 4 hr 1190° C., 3 hr | 571 | 700 | 15 | 99.1 | 17.4 |
| C | 70.7W - 29.3(Cu:Ni = 4.1:1) | 1000° C., 4 hr 1100° C., 4 hr 1180° C., 1 hr | 602 | 685 | 4.5 | 98.9 | 15.6 |

[1]Tension Testing of Metallic Materials, ASTM Test Method E-8

Each sintered alloy exhibited a very fine, homogeneous microstructure. The ranges for the W grain count and the calculated average grain size were $12.4 \times 10^3$ to $39.8 \times 10^3$ grains/mm$^2$ and 10.2 $\mu$m to 5.7 $\mu$m, respectively. Despite the small size of particles, the contiguity of the W framework was effectively lowered to a level of 18–27 percent in order to obtain substantial elongation without slumping. The elongation exhibited for alloy B was similar to that of W heavy alloys which have a substantially coarser microstructure (grain sizes from 30 μm to 100 μm).

The arc erosion rate in $SF_6$ of alloy A was compared with the erosion rate of a W—15Cu pseudoalloy made from a W—Cu composite powder having 15 wt. % Cu and no Ni and two other conventional electrical contact materials consisting of infiltrated W—Cu pseudoalloys. The purpose of the test was to assess the applicability of the alloys as electrical contact materials in high power interrupters. The change in mass of both the anode and the cathode were recorded and volume burnoff for both contacts was determined based on the density of the material. The arcing behavior of the Alloy A in $SF_6$ was similar to that of the reference materials but Alloy A exhibited lower erosion rates. Furthermore, Alloy A demonstrated an erosion rate that was practically linear as a function of current density and, at the higher current densities, was within the range of the best conventional electrical contact materials previously tested in an $SF_6$ environment. Alloy A also demonstrated a very consistent performance in air. Arced contacts showed no structural disintegration of the recrystallized surface material in spite of moderate cracks which are characteristic of all electrical contact materials operating in air. The erosion rates of Alloy A were even lower than other conventional contact materials in $SF_6$ which is a less harsh environment than air.

While there has been shown and described what are at the present considered the preferred embodiments of the invention, it will be obvious to those skilled in the art that various changes and modifications may be made therein without departing from the scope of the invention as defined by the appended claims.

We claim:

1. A powder blend for making a W—Cu—Ni alloy comprising a W—Cu composite powder and a nickel powder, the W—Cu composite powder comprising individual particles having a tungsten phase and a copper phase wherein the tungsten phase substantially encapsulates the copper phase.

2. The powder blend of claim 1 wherein the nickel powder comprises from about 3 to about 6 weight percent of the blend.

3. The powder blend of claim 1 wherein the nickel powder comprises about 4 weight percent of the blend.

4. The powder blend of claim 1 wherein the copper content of the W—Cu composite powder is from about 10 to about 25 weight percent.

5. The powder blend of claim 1 wherein the copper to nickel weight ratio is from about 4.0:1 to about 4.2:1.

6. The powder blend of claim 5 wherein the copper to nickel weight ratio is 4.1:1.

7. The powder blend of claim 1 wherein the powder blend contains from 70 to 82 weight percent tungsten.

8. The powder blend of claim 7 wherein the weight ratio of copper to nickel is 4.1:1.

9. A W—Cu—Ni alloy comprising a sintered tungsten skeleton containing a Cu—Ni matrix, the alloy having no brittle intermetallics.

10. The W—Cu—Ni alloy of claim 9 wherein the alloy has a sintered density of at least about 99% of the theoretical density.

11. The W—Cu—Ni alloy of claim 9 wherein the alloy exhibits an elongation of about 2% to about 20%.

12. The W—Cu—Ni alloy of claim 11 wherein the alloy exhibits an elongation of about 3% to about 5%.

13. The W—Cu—Ni alloy of claim 11 wherein the tungsten has a calculated average particle size of from about 2.5 to about 15 μm.

14. The W—Cu—Ni alloy of claim 11 wherein the weight ratio of copper to nickel is from 4.0:1 to 4.2:1.

15. The W—Cu—Ni alloy of claim 14 where the weight ratio of copper to nickel is 4.1:1.

16. The W—Cu—Ni alloy of claim 9 wherein the tungsten skeleton has a contiguity of about 15 to about 30 percent.

17. A method for forming a W—Cu—Ni alloy comprising:
   (a) forming a powder blend of a W—Cu composite powder and a nickel powder, the W—Cu composite powder comprising individual particles having a tungsten phase and a copper phase wherein the tungsten phase substantially encapsulates the copper phase;
   (b) pressing the powder to form a compact; and
   (c) sintering the compact to form a W—Cu—Ni alloy.

18. The method of claim 17 wherein the sintering comprises heating the compact at a temperature from about 1180° C. to about 1200° C.

19. The method of claim 18 wherein the compact is sintered at about 1190° C.

20. The method of claim 18 wherein the copper content of the W—Cu composite powder is from about 10 to about 25 weight percent and the copper to nickel weight ratio is from about 4.0:1 to about 4.2:1.

21. The method of claim 18 wherein the powder blend contains from 70 to 82 weight percent tungsten and the weight ratio of copper to nickel is 4.1:1.

* * * * *